US008671560B2

(12) United States Patent
Conn et al.

(10) Patent No.: US 8,671,560 B2
(45) Date of Patent: Mar. 18, 2014

(54) IN SYSTEM REFLOW OF LOW TEMPERATURE EUTECTIC BOND BALLS

(75) Inventors: Robert O. Conn, Hakalau, HI (US); Daniel S. Stevenson, Chapel Hill, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 1023 days.

(21) Appl. No.: 12/798,132

(22) Filed: Mar. 30, 2010

(65) Prior Publication Data

US 2011/0239456 A1 Oct. 6, 2011

(51) Int. Cl.
*H05K 3/20* (2006.01)

(52) U.S. Cl.
USPC ................ 29/831; 29/832; 29/842; 29/854; 174/255; 174/259; 174/260; 174/261; 257/E21.021; 257/E21.508; 257/E23.069; 438/103; 438/106; 438/108; 438/112; 438/119

(58) Field of Classification Search
USPC ........... 29/831, 832, 840, 841, 844, 846, 851, 29/85; 174/255, 259, 260, 261; 257/738, 257/780, 778, E21.021, E23.069, E21.508; 361/772, 777, 779; 438/103, 106, 108, 438/112, 118, 119, 127
See application file for complete search history.

(56) References Cited

U.S. PATENT DOCUMENTS

| 5,634,268 | A | 6/1997 | Dalal et al. ...................... 29/840 |
| 5,636,104 | A | 6/1997 | Oh ................................. 361/777 |
| 5,796,591 | A | 8/1998 | Dalal et al. .................... 361/779 |
| 6,002,991 | A * | 12/1999 | Conn, Jr. ........................ 702/117 |
| 6,259,159 | B1 | 7/2001 | Dalal et al. .................... 257/738 |
| 6,344,234 | B1 | 2/2002 | Dalal et al. ...................... 427/96 |
| 6,608,376 | B1 * | 8/2003 | Liew et al. ..................... 257/698 |
| 6,679,636 | B1 * | 1/2004 | Gilman et al. ................... 385/90 |
| 8,243,013 | B1 * | 8/2012 | Sprague et al. ................ 345/107 |
| 2009/0237865 | A1 * | 9/2009 | Komazawa et al. ........... 361/528 |
| 2009/0310318 | A1 * | 12/2009 | Ahmad .......................... 361/760 |

* cited by examiner

*Primary Examiner* — Paul D Kim
(74) *Attorney, Agent, or Firm* — Imperium Patent Works; David D. Eaton; Darien K. Wallace

(57) ABSTRACT

Low temperature bond balls connect two structures having disparate coefficients of linear thermal expansion. An integrated circuit is made to heat the device such that the low temperature bond balls melt. After melting, the bond balls solidify, and the device is operated with the bond balls solidified. In one example, one of the two structures is a semiconductor substrate, and the other structure is a printed circuit board. The integrated circuit is a die mounted to the semiconductor substrate. The bond balls include at least five percent indium, and the integrated circuit is an FPGA loaded with a bit stream. The bit stream configures the FPGA such that the FPGA has increased power dissipation, which melts the balls. After the melting, a second bit stream is loaded into the FPGA and the FPGA is operated in a normal user-mode using the second bit stream.

17 Claims, 10 Drawing Sheets

IN SYSTEM REFLOW OF LOW TEMPERATURE EUTECTIC BOND BALLS

TECHNICAL FIELD

The present disclosure generally relates to in system reflow of bond balls, and more specifically to affixing a semiconductor substrate to a printed circuit board with low temperature eutectic bond balls.

BACKGROUND INFORMATION

The current state of the art of semiconductor development is the mass production of large integrated circuits "IC's" containing several million active components. One type of device fitting this description is a large Field Programmable Gate Array "FPGA." FPGAs and other devices may operate at speeds of several hundred Megahertz and it is not unusual that these integrated circuits include over a thousand pins that bring high speed signals into and out of the integrated circuit die. With a large number of active internal components switching at high speeds, these devices consume large amounts of power. Therefore it is necessary to have a packaging solution that allows for the distribution of over a thousand high speed signal lines and also provides for a plurality of connections to supply power to the device. To solve this problem for a single FPGA, IC designers have used a technique wherein thousands of "bumps" are distributed over the surface of the FPGA via thick metal lines. It would not be unusual to have two-thousand bumps for power and another two thousand for ground. The large number of bumps reserved for power ensures only a minimal resistive drop from the surface of the device to the active devices within the FPGA.

The power and signal connections extend from the bumps present on the surface of the FPGA to balls of a Ball-Grid-Array "BGA" package. A BGA utilized for packaging a large FPGA has approximately 1500 balls; 1000 for input and output "I/O" connections and 500 for power and ground connections. Power is supplied to the balls of the BGA package through thick metal conductors to the bumps present on the surface of the FPGA. A drawing of a BGA package is shown in FIG. 1 (Prior Art). A plurality of bond bumps 3 are shown disposed between FPGA die 5 and package PCB 1. Array of bond balls 2 are shown attached to a lower surface of the package PCB 1 and are coupled to bond bumps 3 of FPGA die 5 with conductors within the PCB (not shown). The array of bond balls 2 are used to connect the BGA package to a system containing several similar devices and other components. Bond bumps 3 are attached to solder reflowable bond pads (not shown) on the package PCB 1. The bond pads are then connected layers of interconnect metal within the package PCB. The bond bumps 3 and bond pads are made of materials selected to provide sufficient electrical and mechanical contact between FPGA integrated circuit die 5 and the package PCB 1. For instance bond bumps 3 may be made of an alloy containing tin and lead. The package PCB may be an FR4 type circuit board constructed of woven glass and epoxy. Because the FPGA die may consume large amounts of power during operation, the mechanical connection will be subjected to stress and potential electrical failure from temperature changes caused by power dissipation in the FPGA die and other devices. For example, the coefficient of linear thermal expansion for the FR4 type PCB 1 is approximately eleven parts per million per degree Centigrade "ppm/° C." The same coefficient for silicon of the FPGA die is three ppm/° C. Because of this disparity, it is possible for the linear expansion to cause electrical conductors in FPGA die 5 to delaminate from the silicon substrate of FPGA die 5. Furthermore, thermal cycling may cause grain growth in bond bumps 3 and may increase the likelihood of voids and cracks developing within bond bumps 3. The presence of voids or cracks is likely to cause a decrease in electrical conductivity or failure of continued electrical and mechanical contact between FPGA die 5 and package printed circuit board 1.

In an electrical system containing several FPGA die and other components, multiple levels of assembly may be required. The BGA package of FIG. 1 and other devices may be assembled to a larger system-level printed circuit board which may further be a component of an even larger system. To interconnect each level of assembly, the system temperature is increased to the melting point of the solder balls or solder bumps between components. Repeated high temperature cycling of the components can fatigue the materials present in the PCB's. One approach to solve this problem is to lower the temperature by providing a solder ball with a lower melting point. U.S. Pat. No. 6,379,982 discloses one of these structures and is shown in FIG. 2.

FIG. 2 is a cross-sectional drawing of a solder ball 13, a low melting point metal layer 11, bond pad 12, integrated circuit "IC" chip interconnect 16, and substrate 15. Solder ball 13 is a reflowed high melt (ninety-seven percent lead and three percent tin) solder ball that is positioned above bond bad 12. Bond pad 12 is a solder wettable pad that makes contact through a via to IC chip interconnect 16 which is a copper trace disposed within conventional substrate 15 and covered by passivation layer 17. Low melting point layer 11 is a low melting point metal such as tin, bismuth, indium, or alloys of these materials and is disposed upon solder ball 13. When the interconnect structure of FIG. 2 is subjected to a low temperature joining cycle, a volume of eutectic alloy is formed atop the solder ball 13. When subjected to additional eutectic temperature cycles, the volume of eutectic alloy melts and forms a structure with improved thermal fatigue resistance and also allows for easy removal of the IC chip for the purpose of testing or replacement.

A semiconductor substrate has also been invented as a solution to failures caused by devices manufactured on substrate materials with disparate coefficients of linear expansion and is shown in FIG. 3. FIG. 3 shows a semiconductor substrate 9 and a plurality of FPGA dice 5-8 disposed on semiconductor substrate 9. Arrays of bond bumps 3 are disposed between FPGA dice 5-9 and semiconductor substrate 9. The bond bumps 3 mechanically and electrically connect FPGA dice 5-9 to semiconductor substrate 9. Because the FPGA die and the semiconductor substrate 9 are both capable of being constructed from a silicon substrate, the coefficients of linear expansion are approximately equal. Thus the likelihood of failure caused by materials having disparate coefficients of linear expansion is reduced.

FIG. 4 is a cross-sectional drawing of the semiconductor substrate 9 of FIG. 3. An interconnect structure 20 containing a "thin conductor layers portion" 22 characterized as having a plurality of thin fine-pitch conductors is disposed onto a "power connection structure" 30. A plurality of thick horizontal conductors is disposed within a "thick conductor layers portion" 31 within power connection structure 30 and a plurality of through-holes extends vertically through a semiconductor power through-hole portion 32 within the power connection structure 30. These thick horizontal conductors present within the power connection structure 30 are of a thickness of approximately two microns or greater. A conductive via is disposed within each through-hole. An example of a through-hole containing a conductive via 33 is shown disposed within the semiconductor power through-hole portion 32. A plurality of bonding bumps 3 is disposed upon the thin conductor layers portion 22. The bond bumps are arrayed to match the corresponding array of die bond pads 24 present on the FPGA dice 5-8 of FIG. 3. The bond bumps conduct power to the FPGA dice through vertical vias within through-holes of the power connection structure 30 to thick horizontal conductive layers present within the thick conductor layers portion 31. The thick conductor layers are then electrically coupled to a thick conductor layer present on the bottom plane of the semiconductor power through-hole portion by the conductive vias disposed within the semiconductor power through-hole portion 32. In this manner, a large amount of current required by the FPGA devices is conducted vertically through the power connection structure 30 to thick conductors within the thick conductor layers portion 31 to vias extending through the interconnect structure 20 to the bond pads 24 and then to bond bumps 23 that interface to the power connections on the surface of FPGA dice 5-8 of FIG. 3. This provides for low resistance power connections through the substrate while simultaneously allowing the maximum density of thin fine-pitch conductor interconnects within the interconnect structure 20 for routing signals between the plurality of FPGA dice 5-8 of FIG. 3 disposed on semiconductor substrate 9.

The semiconductor substrate 9 of FIG. 4 may be constructed by coupling portions manufactured by disparate processing techniques. For example, thin conductor layers portion 22 may be constructed by traditional wet-etch processing methods. Furthermore, power connection structure 30 may be processed using traditional dry-etch processing methods. Once thin conductor layers portion and thick conductor layers portion 32 are processed they can be joined together by fusion bonding the two structures. Fusion bonding permits the planar surfaces of interconnect structure 20 and power connection structure 30 to contact each other physically within atomic dimensions such that direct bonds exist between the two structures obviating any need for adhesive material between the two structures. In other embodiments, interconnect structure 20 and power connection structure 30 are connected through the use of adhesive materials between the structures.

The semiconductor substrate 9 supports routing signal connections between a plurality of semiconductor ICs with thin, fine-pitch conductors and conduction of power to the semiconductor ICs through thick conductors with large feature sizes. However it is necessary to make power connections to the semiconductor substrate 9. It is also necessary to route signals to and from FPGA dice 5-9 from other components not located on the same semiconductor substrate. One method of making power connections and signal connections to the semiconductor substrate is with Shin-Etsu conductive elastomeric connectors from Shin-etsu Polymer Co., Ltd. However, these connectors have a higher profile than solder balls, cost more to manufacture than solder balls, and are not as fine in pitch as those allowed with solder ball interconnections. Another possible method of making power connections is to connect large copper bus bars to the backside of the semiconductor substrate 9. However, a large thick bar of copper has disparate coefficients of linear expansion compared to semiconductor substrate 9 and thus delamination of the copper layers of power connection structure 30 from semiconductor substrate 9 may occur. Furthermore, a semiconductor substrate is not a suitable substrate for supporting the multiple types of components that are also part of the system. These components include: fiber-optic connectors, crystal oscillators, voltage regulators, and other types of components and connectors. In addition, the aforementioned connections means are not easily removed without destroying the semiconductor substrate if semiconductor substrate 9 requires rework or additional testing.

A substrate capable of connection to a semiconductor substrate is therefore desired which allows 1) robust mechanical and electrical connection; 2) interfacing to thousands of high density IC chip interconnections; 3) low resistance conductors capable of supporting high current, power connections; 4) mounting of physical connectors and a variety of electrical components; and 5) nondestructive detachment for test or qualification of the semiconductor substrate.

SUMMARY

Bond ball cracks and voids formed by repeated thermo-mechanically induced stresses are a major source of failure in Ball Grid Array attached semiconductor devices. Low temperature bond balls connect two structures having disparate coefficients of linear thermal expansion. After assembly, and during a scheduled maintenance period in normal operation, an integrated circuit is made to heat the device such that the low temperature bond balls melt and heal any cracks or voids that may have previously formed. Low temperature bond balls connect two structures having disparate coefficients of linear thermal expansion. An integrated circuit is made to heat the device such that the low temperature bond balls melt. After melting, the bond balls solidify, and the device is operated with the bond balls solidified.

In one example, one of the two structures is a semiconductor substrate, and the other structure is a printed circuit board. The integrated circuit is a Field Programmable Gate Array (FPGA) die mounted to the semiconductor substrate. The bond balls include at least five percent indium. The FPGA is loaded with a bit stream. The bit stream configures the FPGA such that the FPGA has increased power dissipation, which melts the balls. After the melting, a second bit stream is loaded into the FPGA and the FPGA is operated in a normal user-mode using the second bit stream.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 1:
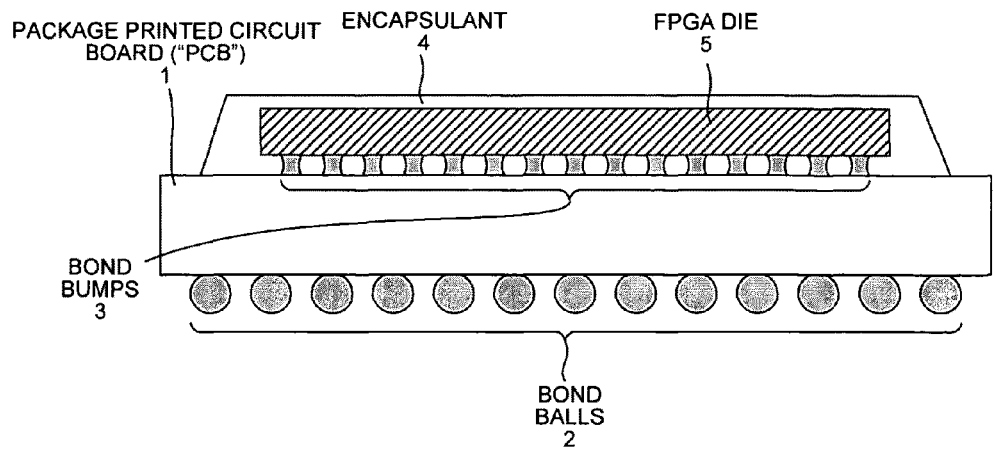
FIG. 1 (Prior Art) is a cross-sectional diagram of a Ball-Grid-Array "BGA" package containing an Field Programmable Gate Array FPGA mounted to a package "Printed Circuit Board" PCB.
Figure 2:
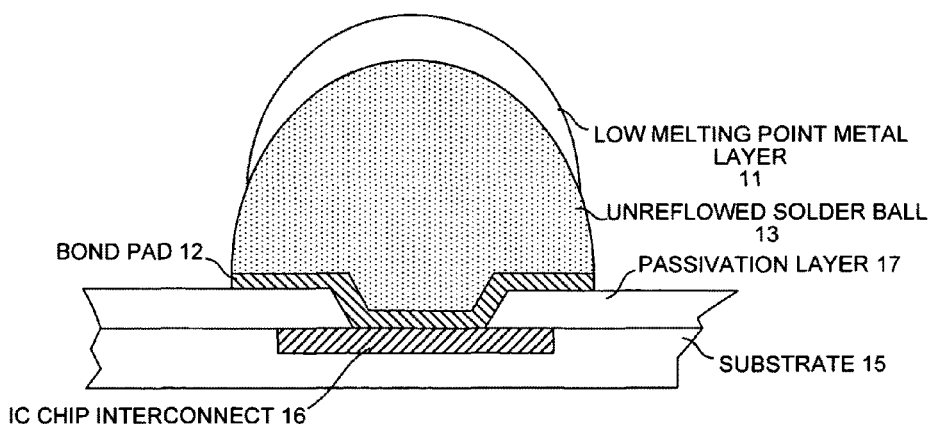
FIG. 2 (Prior Art) is a cross-sectional diagram illustrating a low melting point metal layer disposed onto a solder ball.
Figure 3:
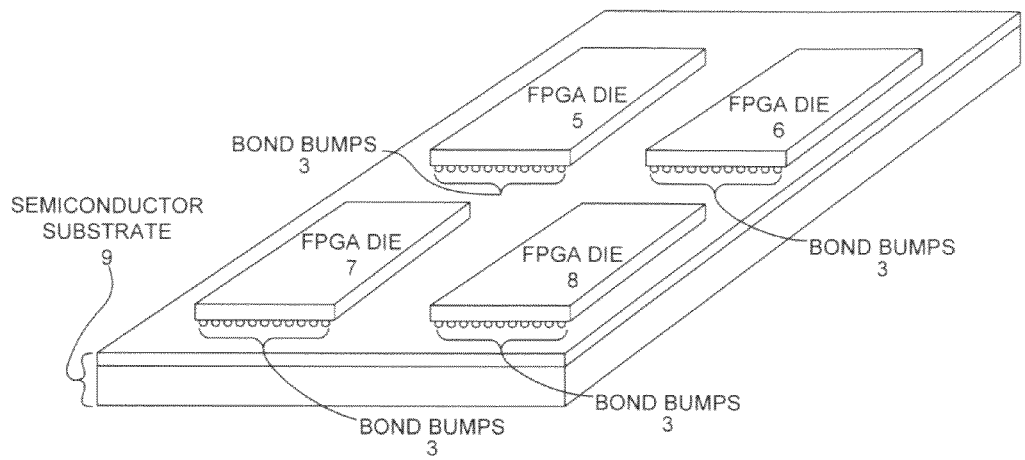
FIG. 3 is a perspective view of a plurality of FPGA dice mounted upon a semiconductor substrate.
Figure 4:
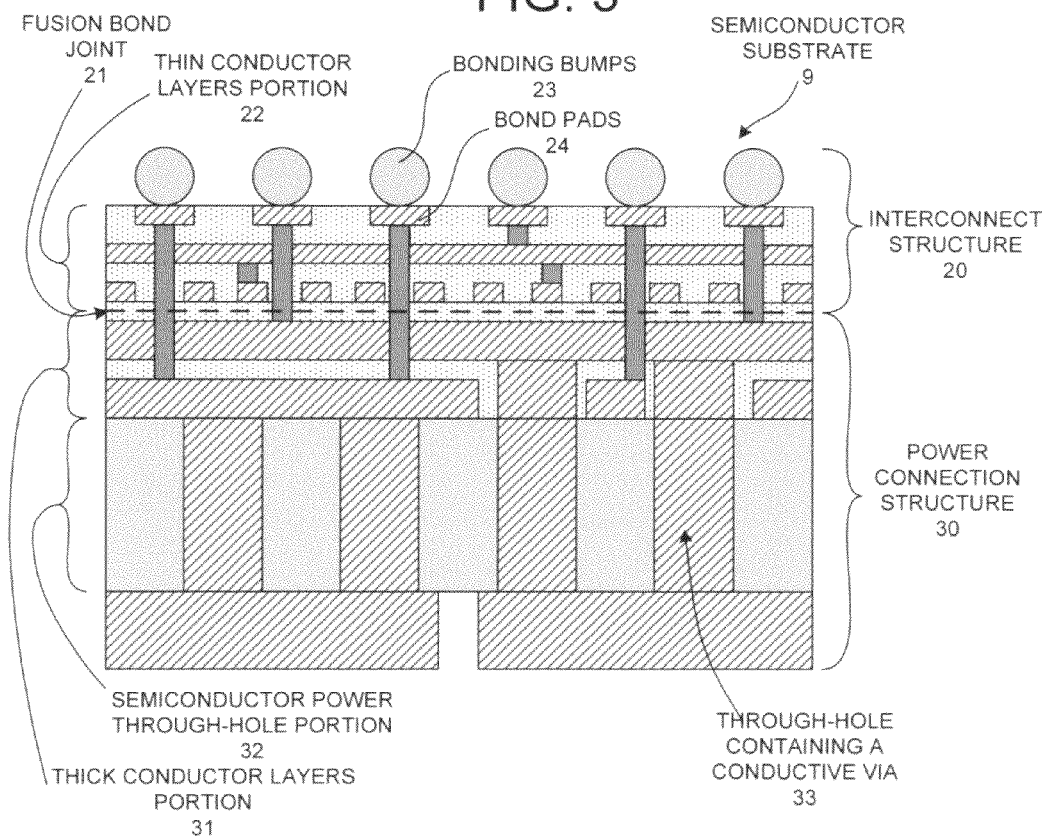
FIG. 4 is a cross-sectional diagram of the semiconductor substrate of FIG. 3 with an interconnect structure adhered to a power connection structure and showing a plurality of through-holes disposed within the power connection structure.
Figure 5:
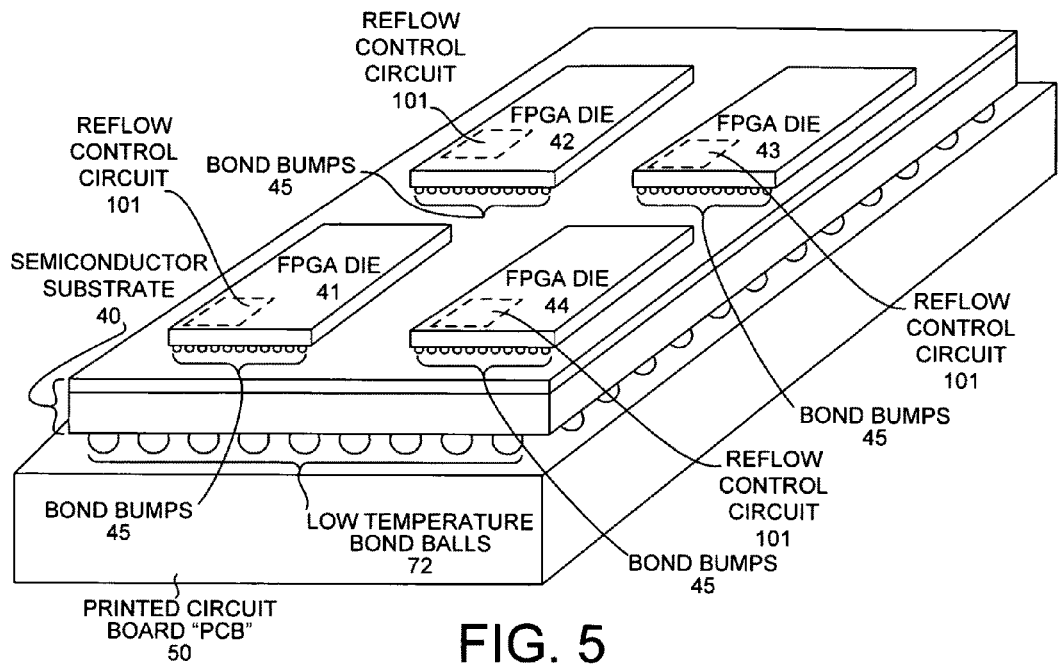
FIG. 5 is a perspective view of a semiconductor substrate mounted upon a Printed Circuit Board "PCB" with low temperature bond balls disposed between the semiconductor substrate and the PCB and wherein FPGAs containing reflow control circuits in accordance with one novel aspect.

FIG. 5 is a perspective view of a semiconductor substrate 40 mounted upon a Printed Circuit Board "PCB" 50. Also shown in FIG. 5 are Field Programmable Gate Array "FPGA" dice 41-44, reflow control circuits 101, bond bumps 45, and low temperature bond balls 72. FPGA dice 41-44 are customer configurable integrated circuits disposed upon the top surface of semiconductor substrate 40. Bond bumps 45 are arrays of solder bumps that are used to electrically and mechanically connect FPGA dice 41-44 to semiconductor substrate 40. Each array of bond bumps 45 are disposed between die bond pads (not shown) on the underside of each FPGA die and bond pads (not shown) on the top surface of semiconductor substrate 40. Bond bumps 45 are solder bumps made of approximately five percent tin alloyed with lead and are selected to provide reliable mechanical and electrical connection between the corresponding bond pads of the FPGA dice and semiconductor substrate. In other embodiments, the FPGA dice and semiconductor substrate are mechanically and electrically connected by bond bumps that do not contain lead or lead alloy. Semiconductor substrate 40 is a structure that supports routing thousands of thin fine-pitch conductors between FPGA dice 41-44 and thick horizontal conductors necessary for making power connections to FPGA dice 41-44. Semiconductor substrate 40 may have a plurality of through-holes extending vertically through semiconductor substrate 40 and may be constructed by coupling portions manufactured by disparate processing techniques. For example, the portion containing the thin fine-pitch conductors may be constructed by traditional wet-etch processing methods and the portion containing the thick horizontal conductors may be processed using traditional dry-etch processing methods. Adhesive materials may be used to join these portions or alternatively they may be fusion-bonded together.

Printed Circuit Board "PCB" 50 is used to mechanically and electrically connect semiconductor substrate 40 and other components (not shown) and may be an FR4 type circuit board constructed of woven glass and epoxy. Low temperature bond balls 72 are shown disposed between semiconductor substrate 40 and PCB 50. Each low temperature bond ball 72 is disposed between a bond pad (not shown) on the underside of semiconductor substrate 40 and a bond pad (not shown) on the top surface of PCB 50. Low temperature bond balls 72 mechanically and electrically connect semiconductor substrate 40 to PCB 50. Low temperature bond balls may be made by screening a low melting point eutectic solder paste onto a surface of PCB 50 and subsequently heating to obtain a solder ball profile approximately three-hundred microns in diameter. Low melting point eutectic solder pastes may be made of low melting point alloys such as Indalloy 77 from Indium Corporation of Utica, N.Y. Indalloy 77 is an alloy of approximately ninety-five percent Gallium and five percent Indium and has liquidus and solidus temperatures of twenty-five degrees centigrade and sixteen degrees centigrade, respectively. To form a mechanical and electrical connection between the semiconductor substrate 40 and PCB 50, the low temperature bond balls 72 must be melted and then solidified. In order to reflow or melt the low temperature bond balls 72, the temperature must be raised approximately twenty degrees centigrade above the liquidus temperature for a duration of approximately thirty seconds. Subsequent cooling causes formation of a fine-grained metallic solid bond ball structure.

Reflow control circuit 101 may be an electronic circuit in FPGA dice 41-44. Reflow control circuit 101 controls the temperature the FPGA dice 41-44 and semiconductor substrate 40. Increasing the temperature of the FPGA dice 41-44 and semiconductor substrate 40 above the liquidus temperature of the low temperature solder balls 72 causes the balls to reflow. Subsequent cooling of the melted low temperature solder balls 72 causes the balls to solidify. In one embodiment, the reflow control circuit determines when reflow or melting of the low temperature bond balls is necessary and causes the FPGA dice 41-44 to operate at temperatures above the liquidus temperature of the low temperature bond balls 72. The increased temperature of FPGAs 41-44 raise the temperature of the attached semiconductor substrate past the liquidus temperature of the low temperature bond balls which subsequently causes the low temperature bond balls 72 to melt. The reflow control circuit 101 subsequently causes the temperature of FPGAs 41-44 to decrease below the solidus temperature and bond balls 72 solidify. Melting the low temperature bond balls and then solidifying produces a fine grained bond between semiconductor substrate 40 and PCB 50. In another embodiment, operation of FPGAs 41-44 changes the temperature of semiconductor substrate 40 and low temperature bond balls 72 because reflow control circuit 101 controls operation of a cooling fan. In yet another embodiment, operation of FPGAs 41-44 changes the temperature of semiconductor substrate 40 and low temperature bond balls 72 because reflow control circuit 101 controls circulation of a coolant fluid surrounding the semiconductor substrate 40. Other embodiments of the invention require a single reflow control circuit 101 instead of multiple reflow control circuits. In other embodiments the reflow control circuit is not within the FPGA.

Figure 6:
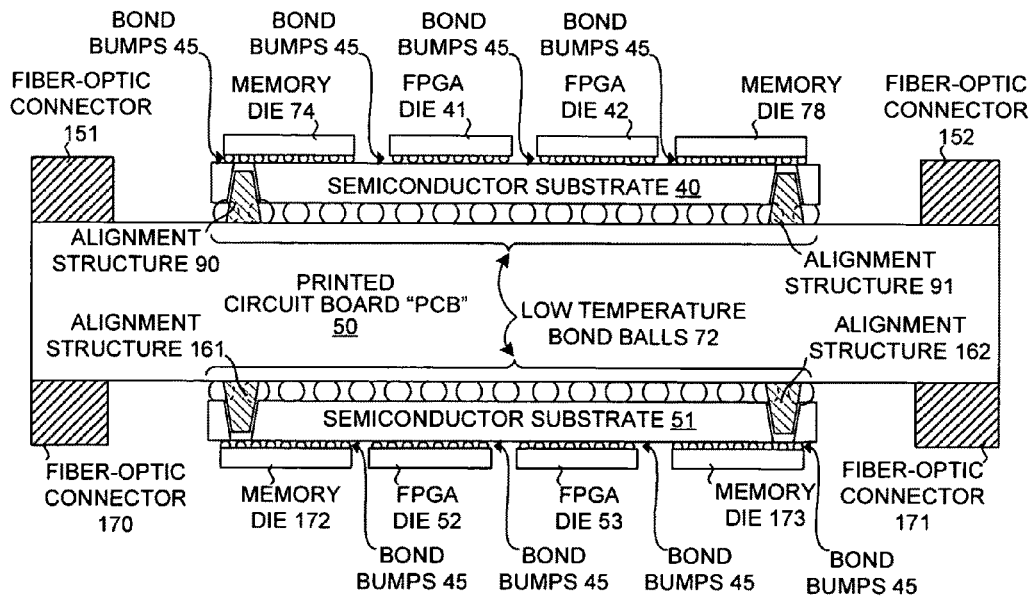
FIG. 6 is a cross sectional diagram of a Printed Circuit Board "PCB" disposed between two semiconductor substrates and wherein low temperature bond balls attach the semiconductor substrates to the PCB.

Semiconductor substrates may be mounted on both sides of a printed circuit board. FIG. 6 is a cross sectional diagram of a printed circuit board "PCB" 50 disposed between two semiconductor substrates 40 and 51. Memory integrated circuit dice 74, 78 and FPGA dice 41, 42 are shown attached to one surface of semiconductor substrate 40 by arrays of bond bumps 45. Semiconductor substrate 40 has interconnect layers (not shown) that route interconnect power connections to memory die 74, 78 and FPGA die 41, 42. Semiconductor substrate 40 is mounted to a top surface of PCB 50. Low temperature bond balls 72 are disposed between semiconductor substrate 40 and PCB 50 and mechanically and electrically connect semiconductor substrate 40 and PCB 50. Fiber-optic connectors 151, 152 and other components (not shown) are attached to one surface of PCB 50. It is possible to bring a signal from outside PCB 50 onto PCB 50 using fiber-optic connectors 151, 152 or other components. For instance, an optical signal could be received by fiber-optic connector 151 and transmitted to FPGA die 42. The optical signal is received by fiber-optic connector 151 and is converted to an signal which is routed to FPGA die 42 via interconnects within PCB 50, low temperature bond balls 72, interconnect lines (not shown) within semiconductor substrate 40, and bond bumps 45.

Semiconductor substrate 51 is attached to another surface of PCB 50 by low temperature bond balls 72. Semiconductor substrate 51 contains FPGA dice 52, 53 and memory integrated circuit dice 172, 173. Arrays of bond bumps 45 electrically and mechanically connect FPGA die 51, 52 and memory die 172, 173 to semiconductor substrate 51. Fiber-optic connectors 170, 171 are mounted to another surface of PCB 50 and similarly connect signals from off of PCB 50 to components attached to semiconductor substrate 51. Signals from components on semiconductor substrate 51 can be routed to components on semiconductor substrate 40 via bond bumps 45 on the bottom surface of semiconductor substrate 51, interconnect lines within semiconductor substrate 51 (not shown), low temperature bond balls 72 mounted on the lower surface of PCB 50, through interconnects (not shown) of PCB 50 to low temperature bond balls 72 on the top surface of PCB 50 through interconnect lines of semiconductor substrate 40 and bond bumps 45 on the top surface of semiconductor substrate 40 to components on semiconductor substrate 40.

When low temperature bond balls 72 are melted, surface tension of the liquefied metal holds semiconductor substrates 40 and 51 in alignment with PCB 50. In some embodiments it may be desirable to provide alignment structures to hold semiconductor substrates 40, 51 in alignment with PCB 50 while melted low temperature bond balls 72 solidify. FIG. 6 contains alignment structures 90, 91, 161, and 162. Alignment structures 90, 91 are attached to the top surface of PCB 50 and protrude into corresponding tapered cavities of semiconductor substrate 40. Alignment structures 161, 162 are similarly attached to the bottom surface of PCB 50 and protrude into corresponding tapered cavities of semiconductor substrate 51. Alignment structures can 90, 91, 161, 162 can be attached to PCB 50 using adhesives and the corresponding tapers can be drilled or etched into the respective semiconductor substrates. As melted low temperature bond balls 72 solidify, alignment structures 90, 91, 161, and 162 guide semiconductor substrates 40 and 51 into alignment with PCB 50. In other embodiments the alignment structures and matching cavities are not tapered.

Figure 7:
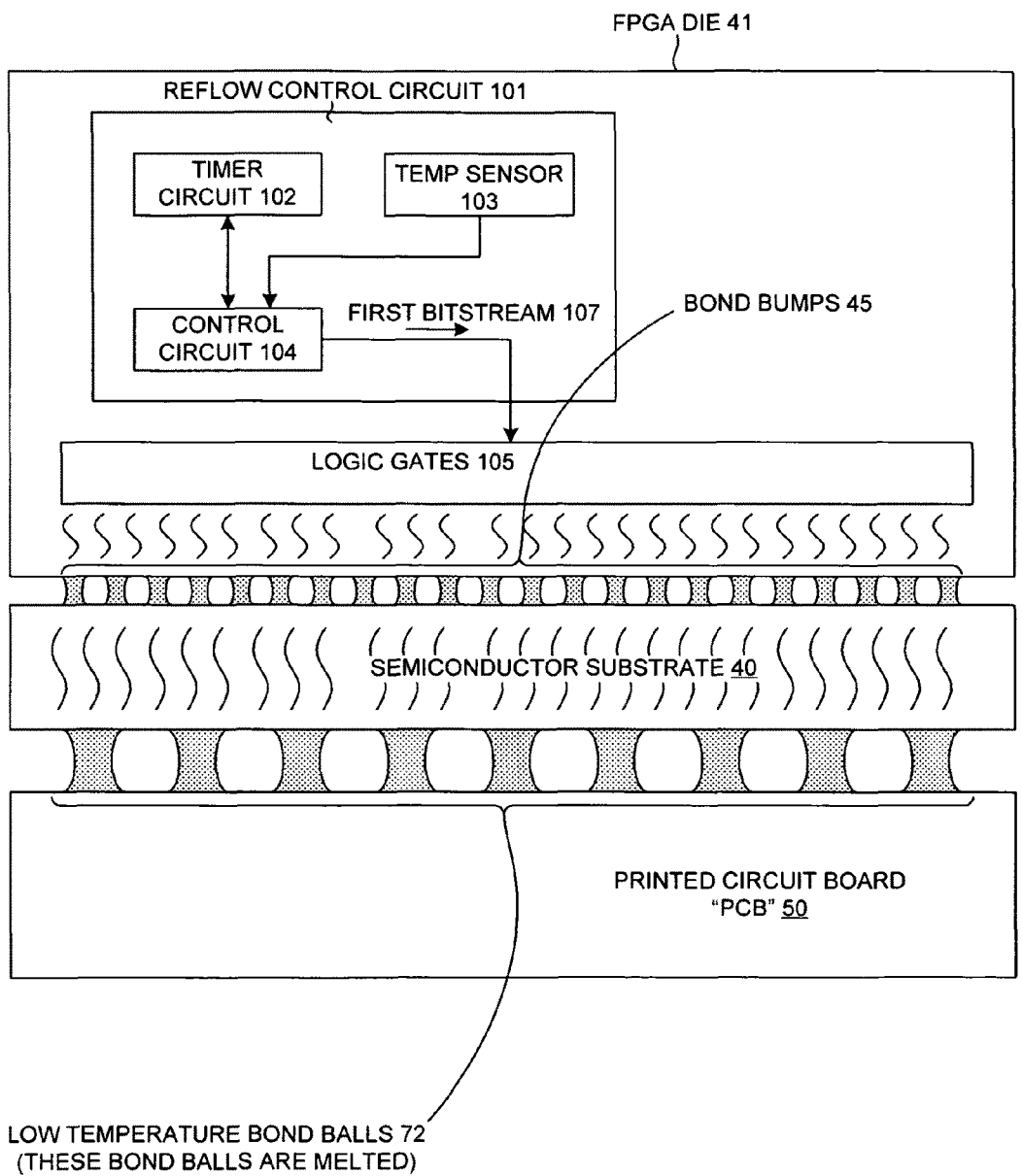
FIG. 7 is a cross-sectional diagram of an FPGA with reflow control circuit, a semiconductor substrate, and printed circuit board and wherein the FPGA causes the low temperature bond balls to melt in accordance with one novel aspect.

FIG. 7 is a cross-sectional diagram of an FPGA integrated circuit die 41, a semiconductor substrate 40, and a PCB 50. FPGA integrated circuit die 41 includes a reflow control circuit 101 and logic gates 105. An array of bond bumps 45 mechanically connects FPGA die 41 to semiconductor substrate 40. An array of low temperature bond balls 72 are shown disposed between semiconductor substrate 40 and PCB 50. The low temperature bond balls 72 electrically and mechanically connect semiconductor substrate 40 and PCB 50. FPGA die 41 contains a reflow control circuit 101 and a plurality of logic gates 105. Reflow control circuit 101 includes timer circuit 102, temperature sensor 103, and control circuit 104. In one novel aspect, timer circuit 102 determines the maximum time duration between reflows and sends a signal to control circuit 104. Control circuit 104 receives the signal and causes the FPGA die 41 to load a first bit-stream 107. The first bit-stream 107 is stored in memory within FPGA die 41. In other embodiments, first bit-stream 107 is loaded from external memory or sources external to FPGA die 41. First bit-stream 107 is loaded into logic gates 105 and causes higher speed operation of FPGA die 41 which causes the temperature of FPGA die 41 to increase. Bit-stream 107 causes increased power dissipation by switching the plurality of logic gates 105. The temperature of the FPGA die is measured by temp sensor 103. The temperature of FPGA die 103 eventually exceeds the liquidus temperature of low temperature bond balls 72. The heat is conducted from the FPGA die, through bond bumps 45, and semiconductor substrate 40 to low temperature bond balls 72. Low temperature bond balls subsequently melt and may remove voids in the bond balls caused by temperature fatigue. Control circuit 104 may also regulate the rate of increase of temperature. When control circuit 104 receives a signal from the temperature sensor 103 indicating a temperature sufficient to melt low temperature bond balls 72, control circuit 104 sends a signal to timer circuit 102 enabling the timer circuit to count the duration of reflow. Once the timer circuit 103 indicates reflow duration is complete, the control circuit 104 resets timer circuit 102 and loads a second bit-stream into logic gates 105 which allows the FPGA die 41 to enter a normal operating mode. FPGA die 41, semiconductor substrate 40, and low temperature bond balls 72 subsequently cool to less than the solidus temperature of low temperature bond balls 72.

In alternative embodiments, control circuit 104 loads a bit-stream that does not cause higher speed operation but instead causes more of logic gates 105 to switch and dissipate heat energy. In yet another embodiment, control circuit 104 enables or disables a system fan (not shown) in order to raise or lower the temperature of FPGA die 41, semiconductor substrate 40, and low temperature bond balls 72. In yet another embodiment, the control circuit 104 is able to regulate the flow of coolant fluid in the system to control temperatures.

In another embodiment, the low temperature bond balls 72 may allow nondestructive detachment of semiconductor substrate 40 from PCB 50 during test or qualification. After the testing of semiconductor substrate 40 is complete, the bond balls 72 are heated until they melt. After melting, power is removed from semiconductor substrate 40 and the semiconductor substrate is removed from PCB 50 before the melted bond balls 72 solidify. In some embodiments a Light Emitting Diode ("LED") is used to indicate when bond balls 72 are in their melted state and as a signal to disconnect power from semiconductor substrate 40.

Figure 8:
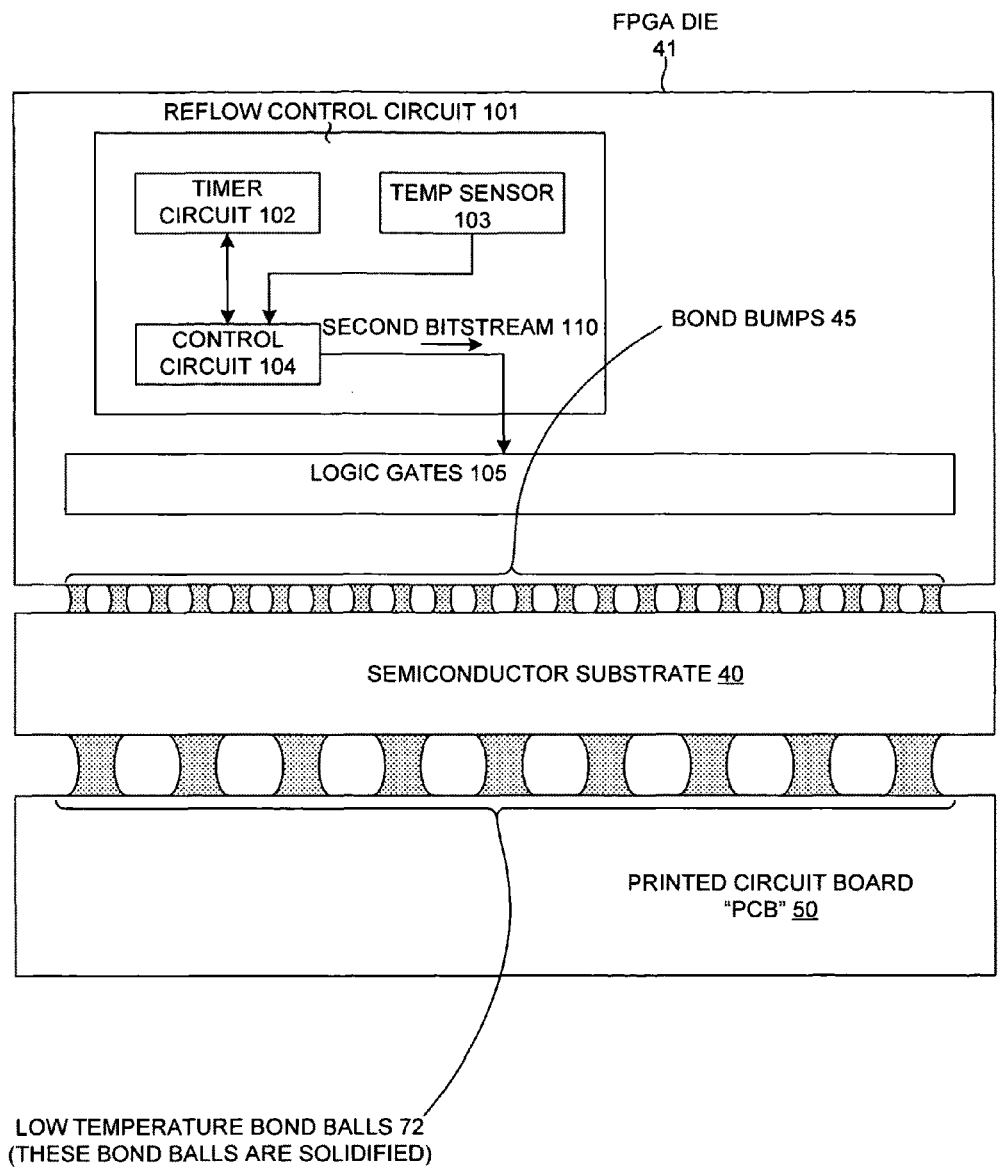
FIG. 8 is a cross-sectional diagram of an FPGA with reflow control circuit, a semiconductor substrate, and printed circuit board and wherein the FPGA is configured with a second bit-stream and the low temperature bond balls are not melted.

FIG. 8 is a cross-sectional diagram of the system in FIG. 7 but with a second bit-stream 110 being loaded into plurality of logic gates 105 of FPGA die 41. In this drawing, the low temperature bond balls are solid and timer circuit 102 has been reset and is counting the duration until the next "reflow" cycle when the low temperature balls 72 will be melted and subsequently solidified. The subsequent melting and cooling cycles may remove voids and large-grain structures in bond balls 72 and improve fatigue resistance of bond balls 72. In other embodiments, control circuit 104 will cause the low temperature bond balls 72 to melt after a failure in the system has been detected.

Figure 9:
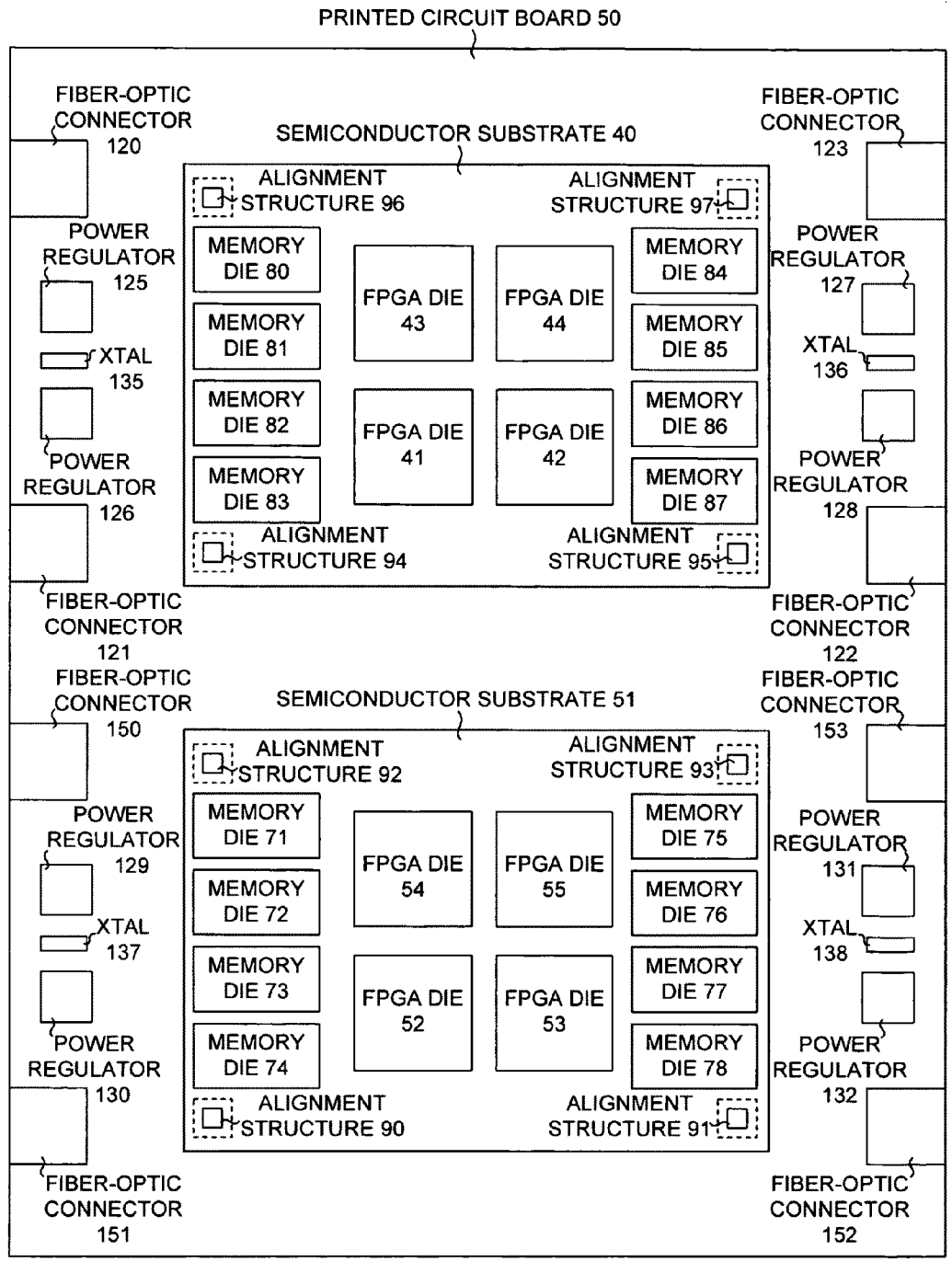
FIG. 9 is a top-down view of a Printed Circuit Board "PCB" containing two semiconductor substrates also showing a variety of electrical components and connectors disposed on the PCB.

FIG. 9 is a perspective view of a Printed Circuit Board "PCB" 50 including two semiconductor substrates 40, 51 and a variety of electrical components and connectors disposed on the PCB 50. Semiconductor substrate 40 includes FPGA dice 41-44, memory dice 80-87, and alignment structures 94-97. Semiconductor substrate 51 includes FPGA dice 52-55, memory dice 71-78, and alignment structures 90-93. PCB 50 includes fiber-optic connectors 120-123, fiber-optic connectors 150-153, power regulators 125-132, and Crystal Oscillators "XTAL" 135-138. These components may be traditionally mounted on printed circuit board substrates. Furthermore, these components may also be required to interface or operate with components mounted onto semiconductor substrates 40, 51. Because signals from components on the PCB 50 can be routed on interconnect lines (not shown) in PCB 50 to components on semiconductor substrates 40, 51 it is not necessary to mount these components on semiconductor substrates 40, 51.

Figure 10:
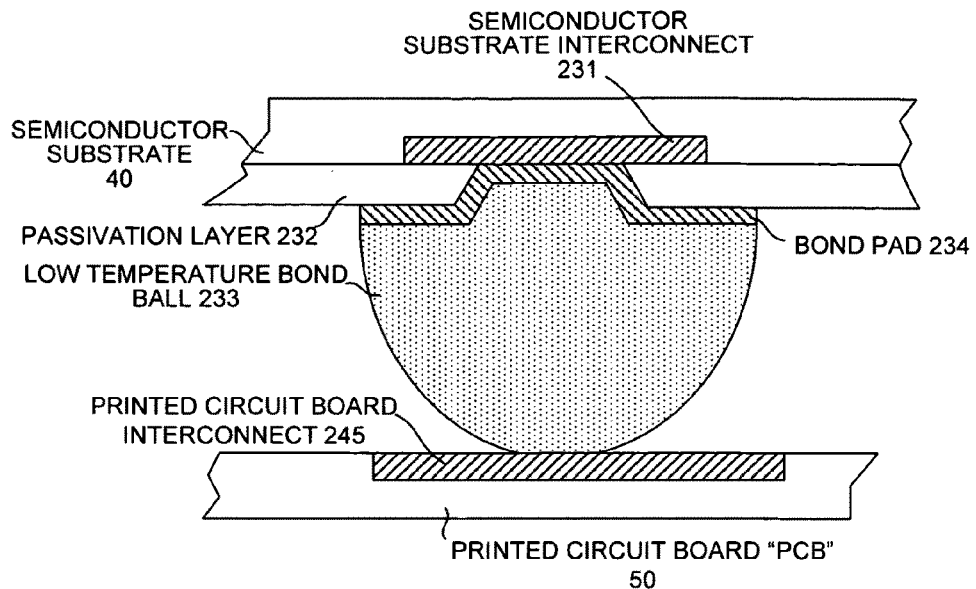
FIG. 10 is a cross-sectional diagram showing a low temperature bond ball in electrical and physical contact with printed circuit board interconnect in accordance with another novel aspect.

FIG. 10 is a cross-sectional diagram showing a low temperature bond ball 233 in electrical and physical contact with an interconnect layer 245 of PCB 50. Low temperature bond ball 233 may be one of Low Temperature bond balls 72 of FIG. 7. FIG. 10 includes semiconductor substrate 40, semiconductor substrate interconnect 231, passivation layer 232, bond pad 234, low temperature bond ball 233, and printed circuit board interconnect 245 of PCB 50. Semiconductor substrate 40 is a circuit board constructed from a silicon substrate. Semiconductor substrate 40 includes semiconductor substrate interconnect 231, a metal interconnect that may include copper. Passivation layer 232 is shown on the bottom surface of semiconductor substrate 40. Passivation layer 232 is a non-conductive material coating on semiconductor substrate 232 that prevents reflowed solder balls from electrically short-circuiting interconnect lines and bond pads. PCB 50 may be an FR4 type circuit board with printed circuit board interconnect 245 that may include copper. Low temperature bond ball 233 is shown disposed between substrate 40, and a PCB 50. Low temperature bond ball 233 may be three-hundred microns in diameter and made of a metal selected from a group comprising bismuth, indium, tin, or alloys thereof.

Figure 11:
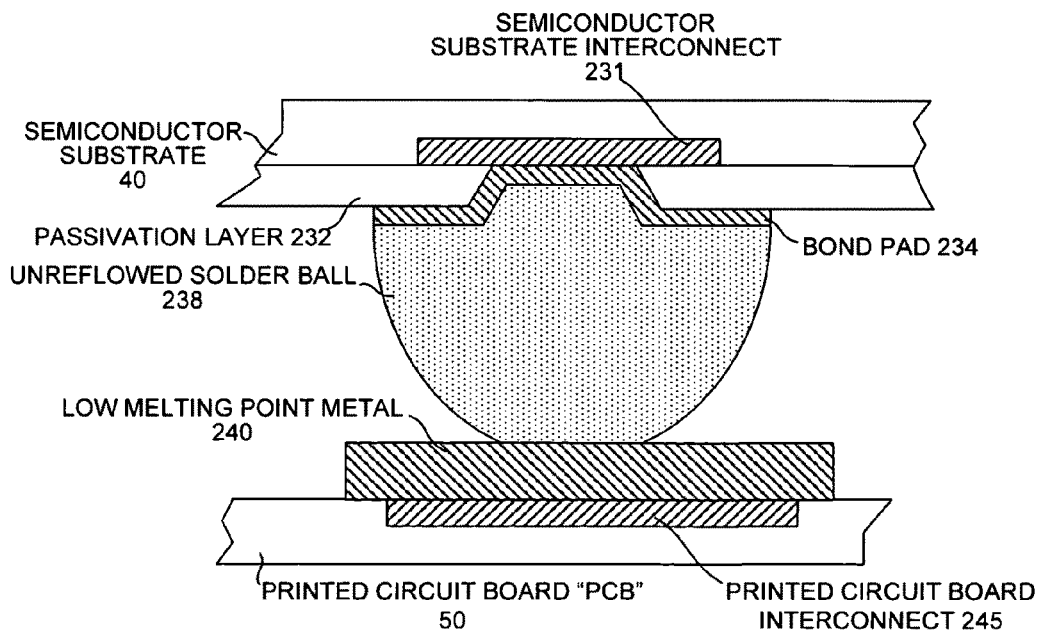
FIG. 11 is a cross-sectional diagram showing a low melting point metal layer disposed onto a Printed Circuit Board "PCB" in electrical and physical contact with a solder ball of a semiconductor substrate that may be used in a system with FPGAs and reflow circuits in accordance with yet another novel aspect.

FIG. 11 is a cross-sectional diagram showing an unreflowed solder ball 238 in electrical and physical contact with a layer of low melting point metal 240. This structure of FIG. 11 may also be used in the system of FIG. 7. Low melting point metal layer 240 is in electrical and physical contact with an interconnect layer 245 of a PCB 50. FIG. 11 also includes a semiconductor substrate 40, semiconductor substrate interconnect 231, passivation layer 232 and bond pad 234. Semiconductor substrate 40 includes a semiconductor substrate interconnect 231 which is a metal interconnect that may include copper. Passivation layer 232 is shown on the bottom surface of semiconductor substrate 40. Printed circuit board interconnect 245 is disposed within PCB and may include copper. Solder ball 238 is shown disposed between bond pad 234 and low melting point metal layer 240. Low melting point metal layer 240 is a metal selected from a group comprising bismuth, indium, tin, or alloys thereof. Unreflowed bond ball 238 is may be a high melting point solder ball such a solder ball made of a lead-tin alloy and may be approximately three-hundred microns in diameter.

To make mechanical and electrical contact between bond pad 234 and printed circuit board interconnect 245, the structure shown in FIG. 11 is heated by reflow control circuits (not shown) and logic gates (not shown) in FPGA dice (not shown) disposed on semiconductor substrate 40. After heating, solder ball 238 and low melting point metal will have joined to create a solder mass of low temperature eutectic alloy. This joining mechanically and electrically connects interconnects 231 and 245 of semiconductor substrate 40 and PCB 50, respectively. Upon subsequent heatings, initiated by reflow control circuits (not shown) of the structure of FIG. 11 the low temperature alloy formed by solder ball 238 and low melting point metal layer 240 melts and remains liquid until the alloy cools below the eutectic temperature and the composition solidifies. These heating and cooling cycles may remove voids formed by thermal fatigue and grain grown and improve the electrical and mechanical connections between semiconductor substrate 40 and PCB 50.

Figure 12:
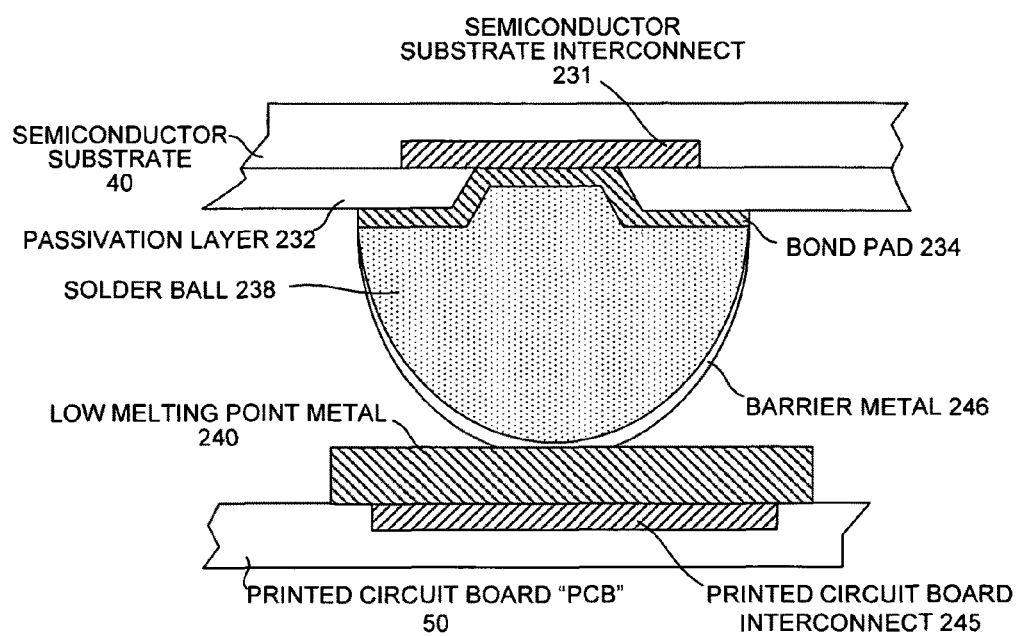
FIG. 12 is a cross-sectional diagram showing a low melting point metal layer disposed onto an unreflowed solder ball of a semiconductor substrate that may be used in a system with FPGAs with reflow circuits in accordance with one novel aspect.

FIG. 12 is a cross-sectional diagram showing of solder ball 238, a printed circuit board interconnect 235, and a low melting point layer 240, and a barrier metal layer. FIG. 12 also includes a semiconductor substrate 40, semiconductor substrate interconnect 231, passivation layer 232 and bond pad 234. Semiconductor substrate interconnect 231 is a metal interconnect that may include copper. Low melting point metal layer 240 is a metal or metal alloy selected from a group comprising bismuth, indium, tin, or alloys thereof. Bond ball 238 may be made of a lead-tin alloy and may be approximately three-hundred microns in diameter. Barrier metal layer 246 may be a thin layer of metal such as nickel, and prevents low melting point metal layer 240 from being absorbed by solder ball 238. In one embodiment, barrier metal layer 246 may be a layer of nickel metal with a thickness of fifty microinches. In another embodiment the barrier metal layer may be gold. Barrier metal layer 246 may be deposited onto solder ball 238 by a masking and deposition processing, or by radio frequency evaporation, e-beam evaporation, electroplating, electroless plating, injection molded or by other processing methods.

To make mechanical and electrical contact between bond bad 234 and printed circuit board interconnect 245, the structure shown in FIG. 11 is heated by reflow control circuits (not shown) and logic gates (not shown) in FPGA dice (not shown) disposed on semiconductor substrate 40. After heating, low melting point metal layer 240 melts and may remove any voids, grain growth and mechanical stress present as a result of thermal fatigue.

Figure 13:
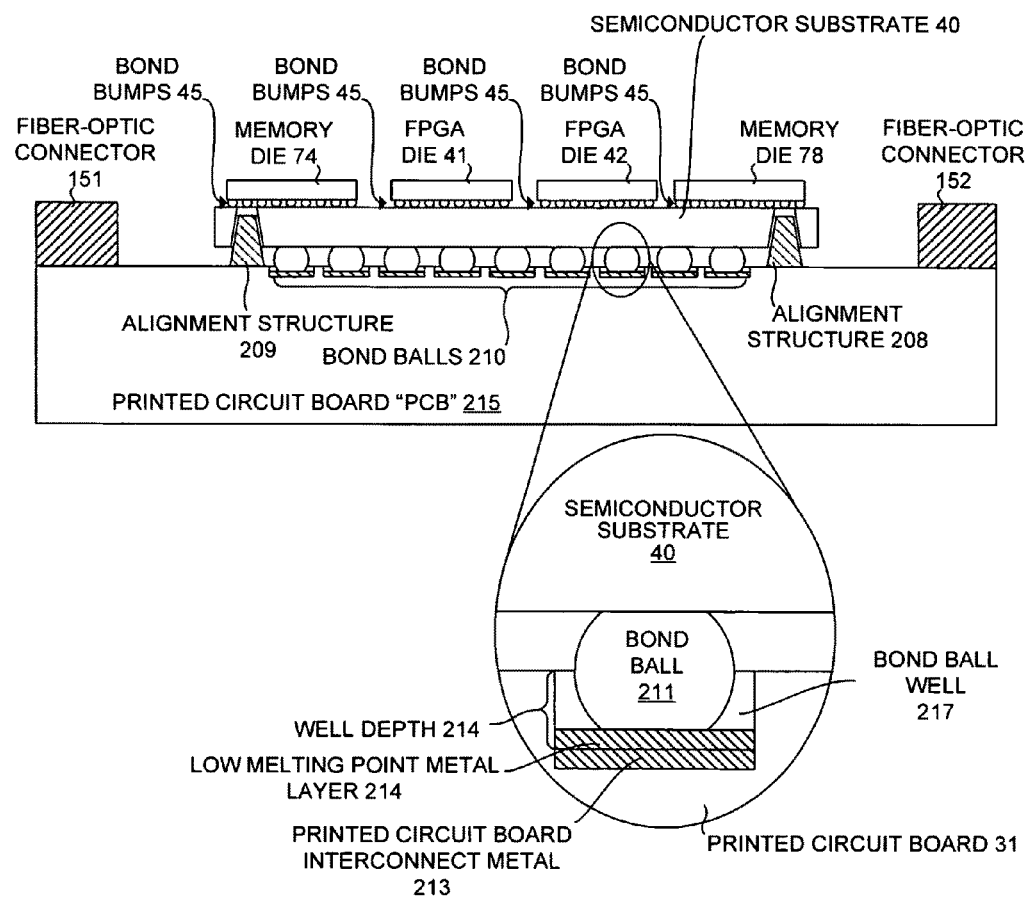
FIG. 13 is a cross-sectional diagram showing a semiconductor substrate, FPGA integrated circuit dice with reflow circuits, and a Printed Circuit Board "PCB" wherein the PCB has wells for receiving bond balls in accordance with another novel aspect.

FIG. 13 is a cross-sectional diagram showing a semiconductor substrate 40, FPGA integrated circuit dice 41, 42 with reflow control circuits, and a Printed Circuit Board "PCB" 215 wherein the PCB 215 has wells 217 for receiving bond balls in accordance with another novel aspect. FPGA integrated circuit dice 41, 42 are shown disposed on a top surface of semiconductor substrate 40. Memory dice 74 and 78 are also shown disposed on semiconductor substrate 40. Arrays of bond bumps 45 are shown disposed between both the FPGA and memory integrated circuits and semiconductor substrate 40. FPGA dice 41,42 and memory die 74, 78 are mechanically and electrically attached to semiconductor substrate 40 by arrays of bond bumps 45. An array of low temperature bond balls 210 are also shown disposed between the semiconductor substrate 40 and PCB 215 and bond balls 210 electrically and mechanically connect semiconductor substrate 40 to PCB 215. Fiber-optic connectors 151 and 152 and other components (not shown) are mounted onto the top surface of PCB 215 and make connections to circuits in memory dice 74, 78 and FPGA dice 41, 42 by interconnect lines in the PCB 215 (not shown) bond balls 210, interconnect within semiconductor substrate 40 (not shown) and arrays of bond bumps 45. PCB 215 may also contain alignment structures 208, 209 that are used to ensure proper electrical and mechanical contact after bond balls 210 have been melted.

FIG. 13 also shows an array of bond ball wells 217 in PCB 215. Bond ball wells 217 extend into printed circuit board 215 and are aligned with each bond ball 210 of semiconductor substrate 40. For a 300 micron bond ball, a bond ball well of well depth 200 microns may be used. The bond ball well may be made by etching or drilling PCB 215. PCB interconnect metal 213 is present on the bottom surface of each bond ball well 217 and is connected to interconnect lines (not shown) within PCB 215. A low melting point metal layer 214 is shown disposed within bond ball well 217; low melting point metal layer 212 is a metal selected from a group comprising bismuth, indium, tin, or alloys thereof.

In the system shown in FIG. 13, FPGA dice 41, 42 contain reflow circuits (not shown) that cause power dissipation in each respective FPGA die. The temperature increase is sufficient to raise semiconductor substrate 40, array of bond balls 210, and low melting point metal layer 214 above the eutectic temperature of low melting point metal layer 214. Low melting point metal layer 214 liquefies and may remove voids present in the metal prior to liquefaction. Bond ball well 217 contains the liquid metal and prevents flow of metal away from bond ball well 217. In other embodiments, the bond ball 211 may include a low temperature metal.

Figure 14:
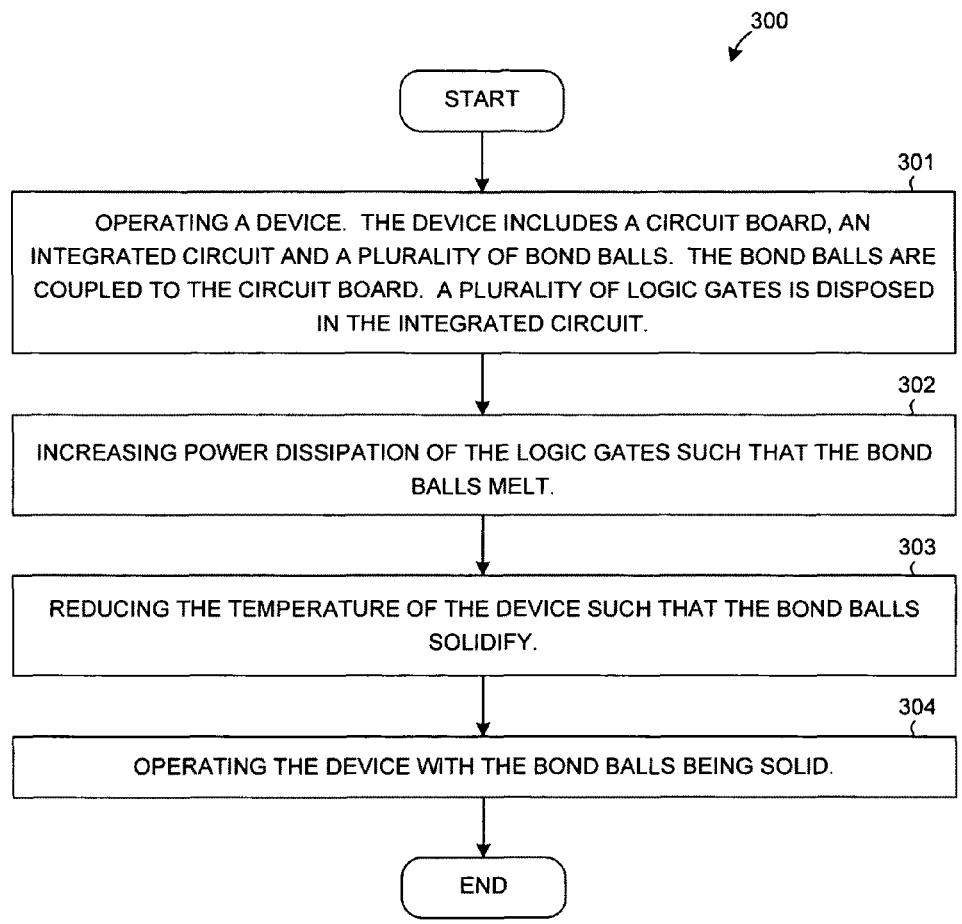
FIG. 14 is a flowchart of a novel method of reflowing bond balls by loading FPGAs with multiple bit-stream patterns.

FIG. 14 is a flowchart of a novel method 300. In a first step (step 301), a device is operated. The device includes a circuit board (for example, PCB 50 of FIG. 5), an integrated circuit (for example, FPGA die 41 of FIG. 5), and a plurality of low temperature bond balls (for example, bond balls 72 of FIG. 5). The bond balls are coupled to the circuit board. The logic gates are part of the integrated circuit.

In a second step (step 302), power dissipation of the logic gates is increased such that the bond balls melt. In one example, power dissipation is increased by loading a particular bit stream into the FPGA.

In a third step (step 303), the temperature of the device is reduced such that the bond balls solidify. In one example, the temperature is reduced by loading a different bit stream into the FPGA.

In a fourth step (step 304), operating the device with the bond balls being solid. In one example, the FPGA is operated using the different bit stream such that the temperature is below the melting point of the bond balls.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
    (a) operating a device comprising a plurality of bond balls and an integrated circuit coupled to a circuit board, wherein the plurality of bond balls are coupled to the circuit board, wherein a plurality of logic gates is disposed in the integrated circuit, wherein the integrated circuit comprises a reflow control circuit, and wherein the device is operated such that the plurality of logic gates has a power dissipation that maintains a temperature of the device such that the plurality of bond balls remain solid;
    (b) after (a) increasing a power dissipation of the plurality of logic gates such that a temperature of the integrated circuit is increased thereby melting the plurality of bond balls, wherein the increasing the power dissipation is performed by the reflow control circuit;
    (c) reducing the temperature of the device such that the plurality of bond balls solidify; and
    (d) after (c) operating the device with the plurality of bond balls being solid.

2. The method of claim 1, wherein the integrated circuit is a Field Programmable Gate Array (FPGA), and wherein the power dissipation is increased in (b) by reconfiguring the FPGA and operating the FPGA as reconfigured.

3. The method of claim 1, wherein the power dissipation is increased in (b) by increasing a clock rate.

4. The method of claim 1, further comprising:
    after (a) and before (b) detecting a failure condition, and wherein the increasing of the power dissipation in (b) is in response to the detecting of the failure condition.

5. The method of claim 1, further comprising:
    detecting a temperature, and based on the detecting of the temperature controlling the power dissipation of the plurality of logic gates in (b).

6. The method of claim 5, further comprising:
    controlling the power dissipation of the plurality of logic gates in (b) such that the temperature of the device is increased greater than 0.5 degrees Centigrade per second.

7. The method of claim 1, wherein the plurality of bond balls comprise indium.

8. The method of claim 1, wherein the plurality of bond balls couples the circuit board to a semiconductor substrate, wherein the semiconductor substrate is coupled by a plurality of bond bumps to the integrated circuit, and wherein the circuit board and the semiconductor substrate have disparate coefficients of linear thermal expansion.

9. An apparatus comprising:
    a circuit board;
    a plurality of bond balls coupled to the circuit board; and
    an integrated circuit comprising a plurality of logic gates and a reflow control circuit, wherein the integrated circuit is coupled to the circuit board, and wherein the reflow control circuit causes the plurality of logic gates to increase power dissipation thereby increasing a temperature of the integrated circuit and melting the plurality of bond balls.

10. The apparatus of claim 9, wherein the reflow control circuit includes a timer circuit, a temperature sensor, and a control circuit.

11. The apparatus of claim 9, wherein the integrated circuit is a Field Programmable Gate Array (FPGA), and wherein the FPGA is configured to implement the reflow control circuit.

12. The apparatus of claim 11, wherein the plurality of bond balls comprise at least five percent (5%) indium.

13. The apparatus of claim 11, wherein the plurality of bond balls couples the circuit board to a semiconductor substrate, and wherein the semiconductor substrate is coupled by a plurality of bond bumps to the integrated circuit.

14. The apparatus of claim 11, wherein the reflow control circuit causes the plurality of logic gates to increase power consumption by increasing a clock rate.

15. The apparatus of claim 14, wherein the reflow control circuit further causes the plurality of logic gates to decrease the power consumption by decreasing the clock rate thereby controlling a rate of temperature change.

16. The apparatus of claim 15, wherein the reflow control circuit controls the rate of temperature change such that the temperature of the apparatus increases greater than 0.4 degrees Centigrade per second.

17. The apparatus of claim 11, wherein the reflow control circuit causes the plurality of logic gates to increase power consumption by reconfiguring the FPGA and operating the FPGA as reconfigured.

* * * * *